(12) United States Patent
Ogawa (10) Patent No.: US 11,302,548 B2
(45) Date of Patent: Apr. 12, 2022

(54) SUBSTRATE STORAGE CONTAINER (71) Applicant: Shin-Etsu Polymer Co., Ltd., Tokyo (JP)

(72) Inventor: Osamu Ogawa, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 84 days.

(21) Appl. No.: 16/615,655

(22) PCT Filed: May 25, 2018

(86) PCT No.: PCT/JP2018/020167
§ 371 (c)(1),
(2) Date: Nov. 21, 2019

(87) PCT Pub. No.: WO2018/221412
PCT Pub. Date: Dec. 6, 2018

(65) Prior Publication Data
US 2020/0083077 A1 Mar. 12, 2020

(30) Foreign Application Priority Data
Jun. 1, 2017 (JP) .............................. JP2017-108879

(51) Int. Cl.
*H01L 21/673* (2006.01)
*F16J 15/10* (2006.01)

(52) U.S. Cl.
CPC ........ *H01L 21/67376* (2013.01); *F16J 15/10* (2013.01)

(58) Field of Classification Search
CPC ... H04L 21/67376; B65D 53/02; B65D 85/30; F16J 15/10

USPC .......................................... 206/806, 701–712
See application file for complete search history.

(56) References Cited

U.S. PATENT DOCUMENTS

| 6,206,196 B1 * | 3/2001 | Krampotich | ...... H01L 21/67373 206/454 |
| 6,354,601 B1 * | 3/2002 | Krampotich | ...... H01L 21/67376 206/710 |
| 6,622,883 B1 * | 9/2003 | Wu | ................... H01L 21/67373 206/710 |
| 7,413,099 B2 * | 8/2008 | Takahashi | .............. B65D 53/02 206/710 |

(Continued)

FOREIGN PATENT DOCUMENTS

| JP | 200268364 A | 3/2002 |
| JP | 2005256958 A | 9/2005 |

(Continued)

*Primary Examiner* — Chun Hoi Cheung
(74) *Attorney, Agent, or Firm* — The Webb Law Firm (57) ABSTRACT

A substrate storage container includes an annular packing provided between a container body for storing substrates and a lid. The container body has a seal surface which is in contact with the packing. The lid is provided with an attachment groove for attaching the packing. The packing is formed of a main body fitted in the attachment groove and an extended piece extending from the main body. The extended piece has a protrusion protruding toward the lid in the closing direction of the lid. A seal portion is located at an end beyond the protrusion. The seal portion is inverted to a side of the seal surface and a side of the main body and comes into contact with the seal surface.

10 Claims, 5 Drawing Sheets

(56) References Cited

U.S. PATENT DOCUMENTS

| | | | |
|---|---|---|---|
| 7,578,407 B2* | 8/2009 | Tieben | H01L 21/67126 |
| | | | 220/326 |
| 8,292,081 B2* | 10/2012 | Sasaki | H01L 21/67376 |
| | | | 206/710 |
| 8,720,693 B2* | 5/2014 | Nagashima | H01L 21/67376 |
| | | | 206/711 |
| 9,261,193 B2* | 2/2016 | Yudovsky | F16J 15/02 |
| 9,426,912 B2* | 8/2016 | Miki | H05K 5/06 |
| 9,520,310 B2* | 12/2016 | Gregerson | H01L 21/67376 |
| 9,644,739 B2* | 5/2017 | Uchida | H01M 10/6556 |
| 2002/0195455 A1 | 12/2002 | Takahashi et al. | |
| 2006/0249512 A1* | 11/2006 | Ueda | H01L 21/67126 |
| | | | 220/378 |
| 2009/0261533 A1* | 10/2009 | Inoue | F16J 15/025 |
| | | | 277/648 |
| 2011/0031705 A1* | 2/2011 | Peddle | B65D 53/02 |
| | | | 277/650 |
| 2013/0127118 A1* | 5/2013 | Sedlar | F16J 15/3224 |
| | | | 277/309 |
| 2015/0147639 A1 | 5/2015 | Uchida et al. | |
| 2020/0185244 A1* | 6/2020 | Ogawa | B65D 43/02 |

FOREIGN PATENT DOCUMENTS

| | | |
|---|---|---|
| JP | 200862979 A | 3/2008 |
| JP | 2015102165 A | 6/2015 |
| JP | 201792229 A | 5/2017 |

* cited by examiner

SUBSTRATE STORAGE CONTAINER

CROSS-REFERENCE TO RELATED APPLICATIONS

This application is the United States national phase of International Application No. PCT/JP2018/020167 filed May 25, 2018, and claims priority to Japanese Patent Application No. 2017-108879 filed Jun. 1, 2017, the disclosures of which are hereby incorporated by reference in their entirety.

BACKGROUND OF THE INVENTION

Field of the Invention

The present invention relates to a substrate storage container for storing a substrate.

Description of Related Art

The substrate storage container comprises a container body that stores substrates, a lid that closes the opening of the container body, and an annular packing provided between the container body and the lid, wherein substrates are stored in an airtight state.

With regard to this type of packing, packings are known in which an extended piece is formed so as to form a substantially acute angle between the extended line thereof and the seal surface, in which the extended piece makes contact with the seal surface and curves toward the outside of the substrate storage container, and in which the extended piece bends toward the outside of the opening front (for example, see Japanese Patent Application Laid-open Publication No. 2002-068364 and Japanese Patent Application Laid-open Publication No. 2008-062970.

Because these packings deform in the direction in which the extended piece is pressed against the seal surface when the inside of the substrate storage container is under a negative pressure, in other words, when the outside pressure is high, a high sealability is achieved.

[Patent Document 1] Japanese Patent Application Laid-open Publication No. 2002-068364

[Patent Document 2] Japanese Patent Application Laid-open Publication No. 2008-062979

DISCLOSURE OF INVENTION

Problem to be Solved by the Invention

However, when a purge gas such as an inert gas is supplied to the inside of the substrate storage container, that is, when the inside of the substrate storage container becomes a positive pressure, because the extended piece deforms in the direction of peeling from the seal surface, sealability may be reduced.

SUMMARY OF THE INVENTION

Therefore, the present invention has been made in view of the above problems, and an object of the present invention is to provide a substrate storage container having improved sealing performance against internal positive pressure.

(1) One aspect of the present invention is a substrate storage container comprising a container body that stores substrates, a lid that closes the opening of the container body, and an annular packing provided between the container body and the lid, wherein the container body has a seal surface which is in contact with the packing, wherein the lid is provided with an attachment groove for attaching the packing, wherein the packing is formed of a main body which is fitted in the attachment groove and an extended piece extending from the main body, wherein the extended piece has a protrusion protruding toward the lid in the closing direction of the lid, and has a seal portion located at an end beyond the protrusion, and wherein the seal portion is inverted to the seal surface side and the main body side and comes into contact with the seal surface.

(2) According to the above aspect (1), wherein a contact position between the seal surface and the seal portion either overlaps with the protrusion or is separated outward from the protrusion when viewed from the closing direction of the lid.

(3) According to the above aspects (1) or (2), wherein one portion of a surface of the extended piece facing the container body is able to approach the lid from the main body toward the protrusion.

(4) According to any one of the above aspects (1) to (3), wherein the main body has a flat surface on at least one of the extended piece side on the container body side or the lid side and the packing is able to be pushed into the attachment groove.

According to the present invention, providing a substrate storage container with improved sealability against an internal positive pressure is possible.

BRIEF DESCRIPTION OF THE DRAWINGS

FIG. 2A shows a plan view.

FIG. 5A shows a plan view.

DESCRIPTION OF THE INVENTION

Hereinafter, embodiments of the present invention will be described in detail with reference to the drawings. Note that in the embodiments of the present specification, the same members are denoted by the same reference numerals throughout.

Figure 1:
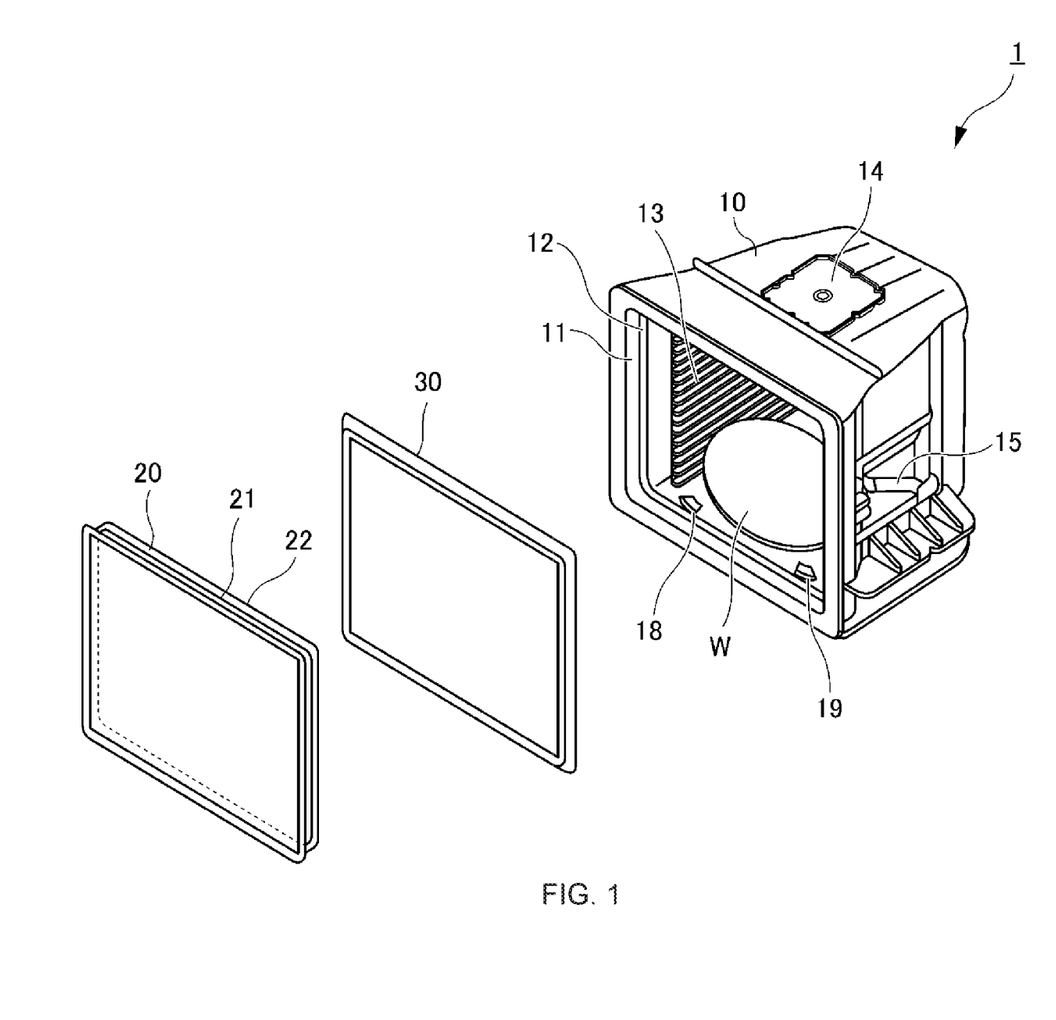
FIG. 1 is an exploded schematic perspective view showing a substrate storage container according to an embodiment of the present invention.
Figure 2A:
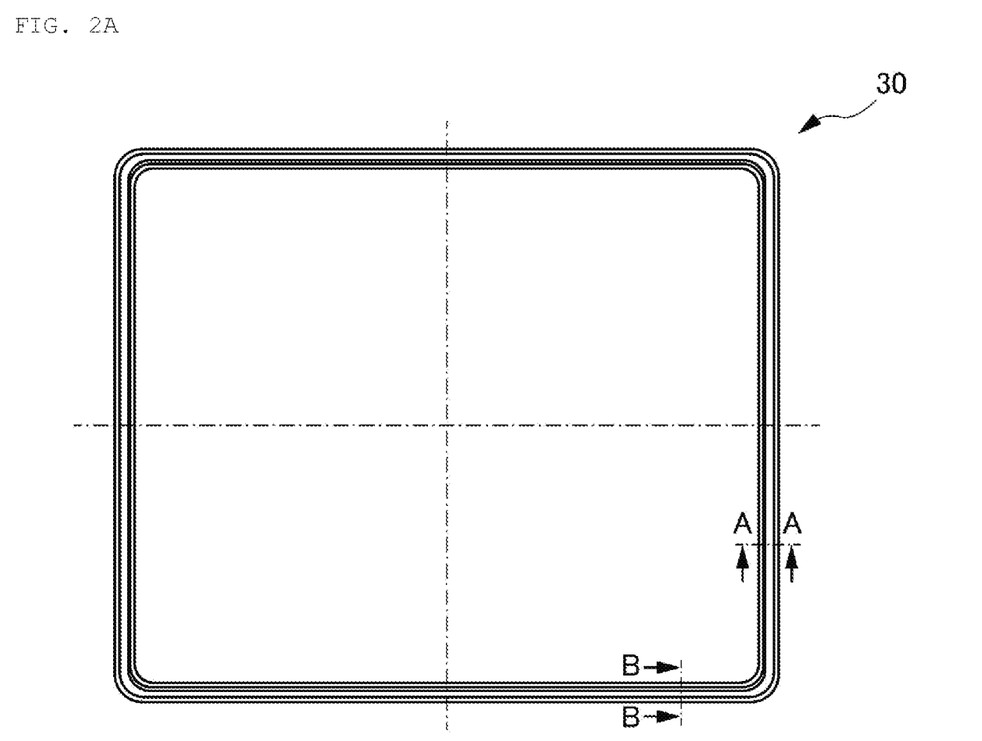
Figure 2B:
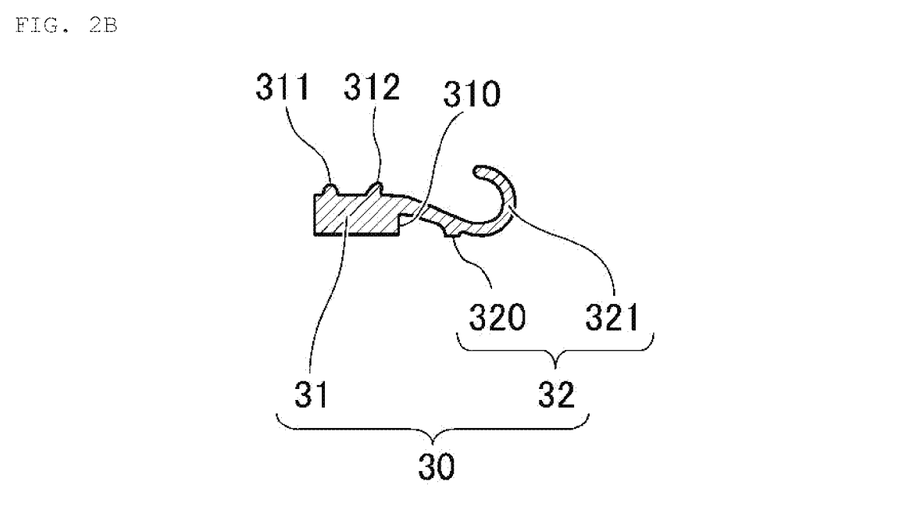
FIG. 2B shows a cross-sectional view taken along the lines AA and BB showing the packing according to an embodiment.
Figure 3:
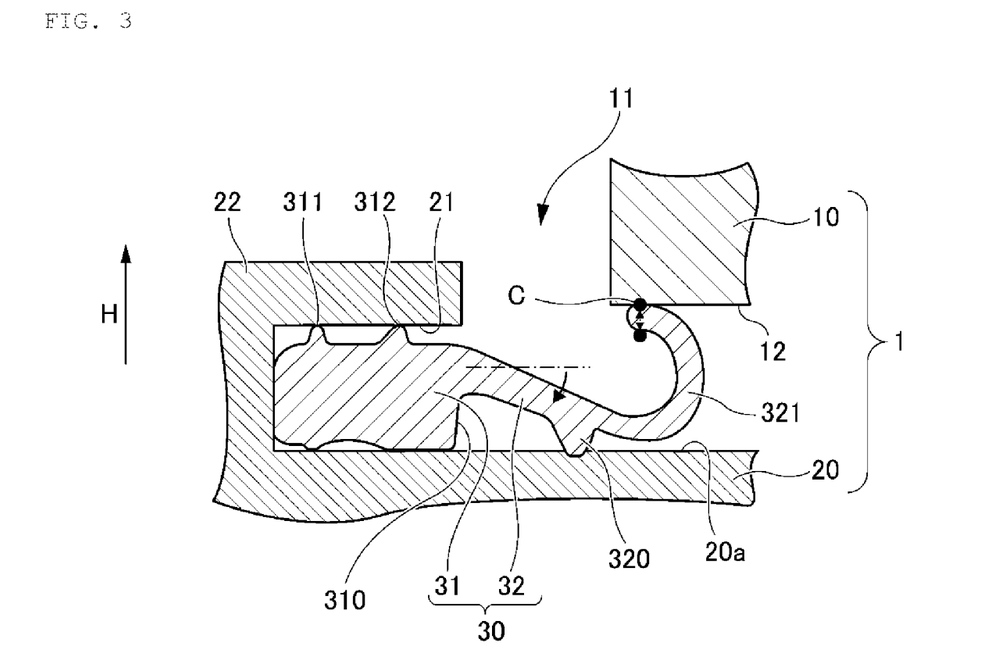
FIG. 3 is a schematic partial cross-sectional view showing a state in which the container body and the lid are in the middle of being closed using the packing of the embodiment.

FIG. 1 is an exploded schematic perspective view showing a substrate storage container 1 according to an embodiment of the present invention. FIG. 2A shows a plan view, and FIG. 2B shows a cross-sectional view taken along the lines AA and BB showing the packing 30 according to an embodiment. FIG. 3 is a schematic partial cross-sectional view showing a state in which the container body 10 and the lid 20 are in the middle of being closed using the packing 30 of the embodiment.

As shown in FIG. 1, the substrate storage container 1 comprises a container body 10 that stores substrates, a lid 20 that closes the opening 11 of the container body 10, and an annular packing 30 provided between the container body 10 and the lid 20.

The container body 10 is a box-like body, and is a front open type in which an opening 11 is formed on the front surface. The opening 11 is bent so as to have a level difference so as to spread outward, and the surface of the level difference portion is formed on the inner peripheral edge of the front of the opening 11 as a seal surface 12 in contact with the packing 30. Note that the container body 10 is preferably a front open type because inserting substrates W having a diameter of 300 mm or 450 mm is easy, but may also be a bottom open type in which the opening 11 is formed on the bottom surface.

Supports 13 are disposed on both left and right sides of the interior of the container body 10. The supports 13 function so as to place and position the substrates W. A plurality of grooves are formed in the supports 13 in the height direction, and constitute so-called groove teeth. Then, the substrates W are placed on two groove teeth on the left and right sides of the same height. The material of the supports 13 may be the same as that of the container body 10, but different materials may also be used to improve cleaning properties and slidability.

Also, rear retainers (not shown) are disposed at the rear (back side) of the interior of the container body 10. If the lid 20 is closed, the rear retainers are paired with front retainers, which will be described later, to hold the substrates W. However, unlike with the present embodiment which has rear retainers, the supports 13 may have, for example, "<"-shaped or linear substrate holders on the back side of the groove teeth so that the substrates W are held by the front retainers and the substrate holders. The supports 13 and the rear retainers are provided on the container body 10 by insert molding, fitting, or the like.

The substrates W are supported by the supports 13 and stored in the container body 10. An example of the substrates W includes silicon wafers, but is not particularly limited, and may be quartz wafers, gallium arsenide wafers, or the like.

A robotic flange 14 is detachably provided at the center of the ceiling of the container body 10. In a clean state, the substrate storage container 1 is held by the robotic flange 14 by a transfer robot in a factory, and are transferred to processing devices for each process for processing the substrates W.

In addition, manual handles 15 that are gripped by an operator are detachably attached to the center portions of the outer surfaces of both side portions of the container body 10.

Then, for example, an air supply valve 18 and an exhaust valve 19 each having a check valve function are provided on the bottom surface of the container body 10. These replace the gas inside the substrate storage container 1 or maintain an airtight state by supplying an inert gas such as nitrogen gas or dry air from the air supply valve 18 to the inside of the substrate storage container 1 which is closed by the lid 20 and discharging the gas from the exhaust valve 19, as necessary. Note that the air supply valve 18 and the exhaust valve 19 are preferably located at positions outside of the positions where they project onto the bottom surface of the substrates W, but the quantities and positions of the air supply valve 18 and the exhaust valve 19 are not limited to those shown in the figures. The air supply valve 18 and the exhaust valve 19 each have a filter for filtering gas.

The replacement of the internal gas is performed for the purpose of blowing off the impurities on the stored substrates W or lowering the internal humidity, thereby maintaining the cleanliness of the inside of the substrate storage container 1 during transport. By detecting the gas on the side of the exhaust valve 19, confirming whether or not the replacement of the gas has been reliably performed is possible. Then, when the internal gas is replaced or when the lid 20 is attached to the container body 10 and is closed, the internal pressure of the substrate storage container 1 becomes positive, or conversely, when the lid 20 is removed from the container body 10, the internal pressure of the substrate storage container 1 becomes negative.

On the other hand, the lid 20 has a substantially rectangular shape that is attached to the front surface of the opening 11 of the container body 10. The lid 20 has a locking mechanism which is not shown, and is locked by fitting a locking claw into a locking hole (not shown) formed in the container body 10. In addition, the lid 20 is detachably fitted or integrally formed with the elastic front retainers (not shown) that hold the front peripheral edges of the substrates W horizontally at the center.

Since the front retainers are portions that are in direct contact with the wafers, just like with the groove teeth and the substrate holders of the supports 13, materials with good cleaning properties and slidability are used. The front retainer can also be provided on the lid 20 by insert molding, fitting, or the like.

Then, an attachment groove 21 for attaching the packing 30 is formed in the lid 20 (see FIG. 3). More specifically, a convex portion 22 smaller than the level difference portion of the opening 11 is formed in an annular shape on the surface of the lid 20 on the container body 10 side, so that the attachment groove 21 having a substantially U-shaped cross section is formed in an annular shape. When the lid 20 is attached to the container body 10, the convex portion 22 enters deeper than the level difference portion of the opening 11.

Examples of the material of the container body 10 and the lid 20 include thermoplastic resins such as polycarbonates, cycloolefin polymers, polyetherimides, polyether sulfones, polyether ether ketones, liquid crystal polymers, or the like. The thermoplastic resins may further include, as appropriate, a conductive agent made of conductive carbon, conductive fiber, metallic fiber, conductive polymer, or the like, various antistatic agents, ultraviolet absorbers, or the like.

Next, as shown in FIG. 2A, the packing 30 has an annular shape corresponding to the front shape of the lid 20 (and the shape of the opening 11 of the container body 10), and in the present embodiment, has a rectangular frame shape. However, the annular packing 30 may be in a circular (ring) shape before being attached to the lid 20.

The packing 30 is disposed between the seal surface 12 of the container body 10 and the lid 20, and when the lid 20 is attached to the container body 10, the seal surface 12 and the lid 20 are in close contact with each other to ensure the airtightness of the substrate storage container 1, which reduces the entry of dust, moisture, etc. from the outside into the substrate storage container 1 as well as reduces gas leakage from the inside to the outside.

With respect to the material for the packing 30, elastic bodies such as thermoplastic elastomers including polyester elastomers, polyolefin elastomers, fluorine elastomers, urethane elastomers, or the like, fluororubber, ethylene propylene rubber, silicone rubber or the like can be used. From the viewpoint of improving adhesion, a predetermined amount of fillers made of carbon, glass fiber, mica, talc, silica, calcium carbonate, or the like, and resins such as polyethylene, polyamide, polyacetal, fluorine-based resin, silicone resin, or the like may be selectively added to these materials. In addition, from the viewpoint of imparting conductivity and/or antistatic properties, carbon fibers, metal fibers, metal oxides, various antistatic agents, or the like may be added as appropriate. Note that the hardness of the packing 30 is preferably 40 to 90 on the Shore A hardness scale, and more preferably 60 to 90.

The packing 30 will be described in more detail. As shown in FIG. 2(*b*), the packing 30 is formed of a main body 31 fitted in the attachment groove 21, and an extended piece 32 extending from the main body 31.

The main body 31 is formed in an annular shape similar to the attachment groove 21 of the lid 20, and has a substantially rectangular shape so that the cross section corresponds to the cross-sectional shape of the attachment groove 21. The main body 31 has a flat surface 310 on the side from which the extended piece 32 extends and the lid 20 side so that the packing 30 can be pushed into the bottom side of the attachment groove 21.

Further, with respect to the main body 31, a first fitting protrusion 311 on the bottom side (inner side) of the attachment groove 21 and a second fitting protrusion 312 on the opening side (outer side) of the attachment groove 21 are formed side by side on the container body 10 side, and the first fitting protrusion 311 and the second fitting protrusion 312 are each formed to be tapered.

On the other hand, the extended piece 32 has a protrusion 320 protruding toward the lid 20 with respect to the closing direction H of the lid 20, and has a seal portion 321 located at an end beyond the protrusion 320. Further, one portion of a surface of the extended piece 32 from the main body 31 toward the protrusion 320 facing the container body 10 is able to approach the lid 20. That is, it stretches toward the lid 20 side from the alternating long and short dash line in the figure showing the horizontal direction.

The seal portion 321 is inverted (in a J shape) toward the seal surface 12 side and the main body 31 side and is in contact with the seal surface 12. At this time, the contact position C between the seal surface 12 and the seal portion 321 either overlaps with the protrusion 320 or is separated outward from the protrusion 320 when viewed from the closing direction H of the lid 20. The thickness of the seal portion 321 is preferably about 0.6 mm, but is not particularly limited as long as there is no problem in molding.

Incidentally, if there is looseness when the packing 30 is fitted into the attachment groove 21 and attached, since the height of the seal portion 321 (from the back surface 20a of the lid 20) to the contact position C varies, the inner peripheral side of the main body 31 of the packing 30 is formed to be slightly smaller (about 1% to 5%) than the annular peripheral surface at the bottom of the attachment groove 21.

Then, as the packing 30 is being attached to the attachment groove 21, the packing 30 is fitted into the attachment groove 21 of the lid 20 in a stretched state. At this time, when the packing 30 is extended so as to exceed the convex portion 22 and the main body 31 is fitted into the attachment groove 21, the extended piece 32 is inclined toward the lid 20, and the protrusion 320 is pressed against the lid 20. In this manner, the height of the seal portion 321 up to the contact position C can be stabilized over the entire packing 30.

Note that FIG. 3 shows the packing 30 in a closed state in which the lid 20 is attached to the container body 10, and the seal portion 321 of the packing 30 is deformed and crushed by about 1 mm in the closing direction H after contacting the seal surface 12.

Finally, the advantages of the substrate storage container 1 according to embodiments of the present invention will be described while comparing the packing 30 of the embodiment with a conventional packing 30R.

Figure 4:
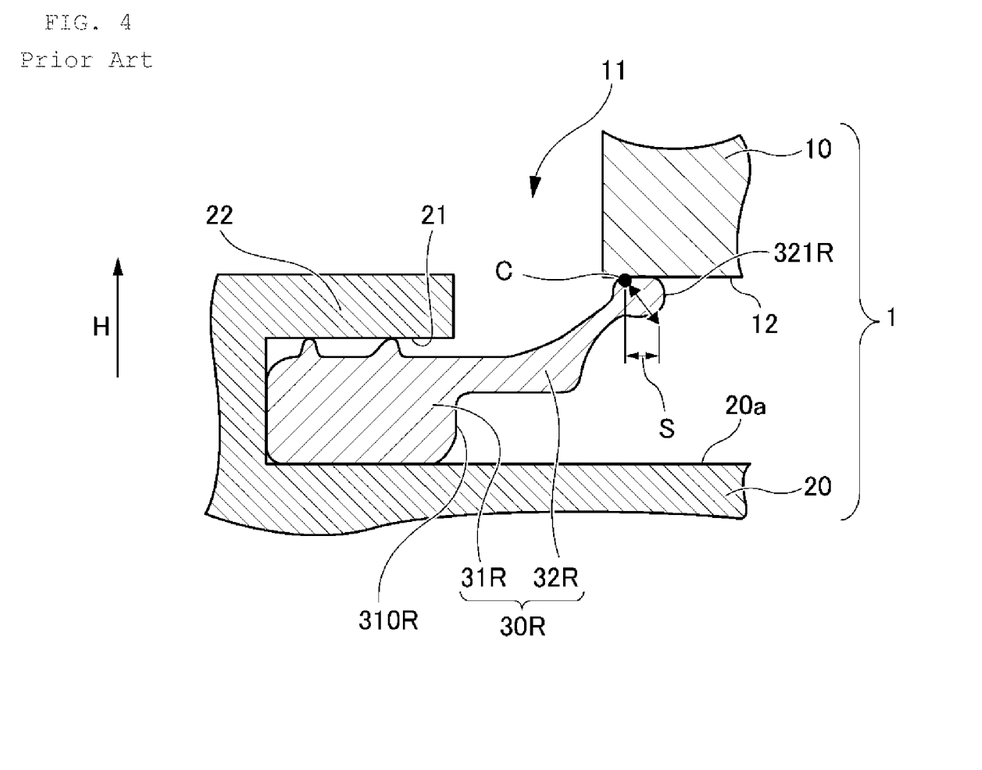
FIG. 4 is a schematic partial cross-sectional view showing a state in which the container body and the lid are in the middle of being closed using a conventional packing.

FIG. 4 is a schematic partial cross-sectional view showing a state in which the container body 10 and the lid 20 are in the middle of being closed using a conventional packing 30R. Note that in FIGS. 3 and 4, the solid arrows indicate the movement locus of the contact position C.

As shown in FIG. 4, the conventional packing 30R is formed by a main body 31R fitted in the attachment groove 21 and an extended piece 32R extending from the main body 31R. The extended piece 32R is formed with a seal portion 321R, and the seal portion 321R is in contact with the seal surface 12 in a bent state without being inverted. Note that the main body 31R has a flat surface 310R.

In the conventional packing 30R, as the lid 20 is closed in the closing direction H with respect to the container body 10, first, the seal portion 321R contacts the seal surface 12 at the contact position C, but, when the lid 20 is further pushed in the closing direction H, the seal portion 321R moves while sliding (sideslipping) in a direction perpendicular to the closing direction H, and eventually, the contact position C moves to a position separated outward by a distance S. For this reason, the seal portion 321R of the packing 30R is likely to generate particles due to sliding.

On the other hand, in the packing 30 of the embodiment, as the lid 20 is closed in the closing direction H with respect to the container body 10, the seal portion 321 first contacts the seal surface 12 at the contact position C, but even when the lid 20 is further pushed in the closing direction H, the seal portion 321 is deformed with respect to the protrusion 320a base point (starting point), so that the seal portion 321 does not substantially move in the direction orthogonal to the closing direction H, and because it only moves along the closing direction H, the contact position C does not move to a position outward from the outside (see FIG. 3). That is, the seal portion 321 of the packing 30 does not slide laterally on the seal surface 12. Even if sideslipping occurs, the sideslipping can be suppressed to about ⅓ or less of the conventional packing 30R distance S. For this reason, the seal part 321 of the packing 30 does not slide, and the generation of particles can be reduced.

Also, since the extended piece 32 has the protrusion 320, as the packing 30 is attached to the lid 20, the protrusion 320 comes into contact with one portion of a surface of the lid 20, so that the height of the seal portion 321 at the end beyond the protrusion 320 becomes constant. Then, by making the height of the seal portion 321 constant, rippling of the seal portion 321 can be suppressed.

Further, the extended piece 32 can similarly suppress the rippling of the seal portion 321 because the one portion of a surface facing the container main body 10 is provided closer to the lid 20 from the main body 31 toward the protrusion 320. Since the rippling of the seal portion 321 is reduced, the contact pressure of the seal portion 321 with respect to the seal surface 12 becomes uniform over the entire circumference, the seal portion 321 of the packing 30 does not slide, and the generation of particles can be reduced.

Then, since the contact width and the maximum contact pressure of the seal portion 321 with respect to the seal surface 12 can be reduced, sticking of the packing 30 to the seal surface 12 can also be reduced. Furthermore, when removing the lid 20 from the container body 10, since the seal portion 321 does not slide on the seal surface 12, and because frictional forces in the direction orthogonal to the closing direction H are not easily generated, the lid 20 can be easily removed from the container body 10.

Incidentally, in the conventional packing 30R, if the inside of the substrate storage container 1 is at a negative pressure, the seal portion 321R is further pressed against the seal surface 12 by the external pressure, and the sealing performance is improved, but if the internal pressure is positive, since the seal portion 321R is pushed by the internal pressure in the direction away from the seal surface 12, the sealing performance deteriorates and gas leaks (see FIG. 4).

On the other hand, in the packing 30 of the embodiment, if the inside of the substrate storage container 1 is at a negative pressure, the seal portion 321 is pushed to the bottom side of the attachment groove 21 by external pressure, but since the protrusion 320 serves as a base point and the elastic force (repulsion force) at the inverting portion is also increased, the sealing performance improves, and if the internal pressure is positive, the seal portion 321 is further pressed against the seal surface 12 by the external pressure, and the sealing performance is improved. As a result, the sealability against the positive pressure is improved by a factor of two or more, and even if the internal pressure is increased by about 6 kPa, the gas does not leak.

Note that in the conventional packing 30R, if the seal portion 321R is soft, the positive pressure becomes weak, but in the packing 30 of the embodiment, since the seal portion 321 is inverted, even if material is soft, because the soft material is pressed against the seal surface 12, the same effect as described above can be obtained.

As described above, the substrate storage container 1 of the embodiment according to the present invention is a substrate storage container 1 comprising a container body 10 that stores substrates W, a lid 20 that closes the opening 11 of the container body 10, and an annular packing 30 provided between the container body 10 and the lid 20, wherein the container body 10 has a seal surface 12 which is in contact with the packing 30, wherein the lid 20 is provided with an attachment groove 21 for attaching the packing 30, wherein the packing 30 is formed of a main body 31 fitted in the attachment groove 21 and an extended piece 32 extending from the main body 31, wherein the extended piece 32 has a protrusion 320 protruding toward the lid 20 in the closing direction H of the lid 20, and has a seal portion 321 located at an end beyond the protrusion 320, and wherein the seal portion 321 is inverted to the seal surface 12 side and the main body 31 side and comes into contact with the seal surface 12.

As a result, when the inside of the substrate storage container 1 becomes a positive pressure, because the seal portion 321 is deformed so as to swell from the protrusion 320 of the packing 30 as a base point, the seal portion 321 is pressed against the seal surface 12. Moreover, when the inside of the substrate storage container 1 becomes a negative pressure, because the seal portion 321 is deformed by being pressed against the bottom side of the attachment groove 21 with the protrusion 320 of the packing 30 as a base point, the elastic force of the seal portion 321 increases and is pressed against the seal surface 12. Thus, the packing 30 of the embodiment can improve the sealability even if the inside of the substrate storage container 1 becomes a positive pressure or a negative pressure, and gas leakage from the inside of the substrate storage container 1 and entry of dust from the outside can be suppressed.

Modifications

Figure 5A:
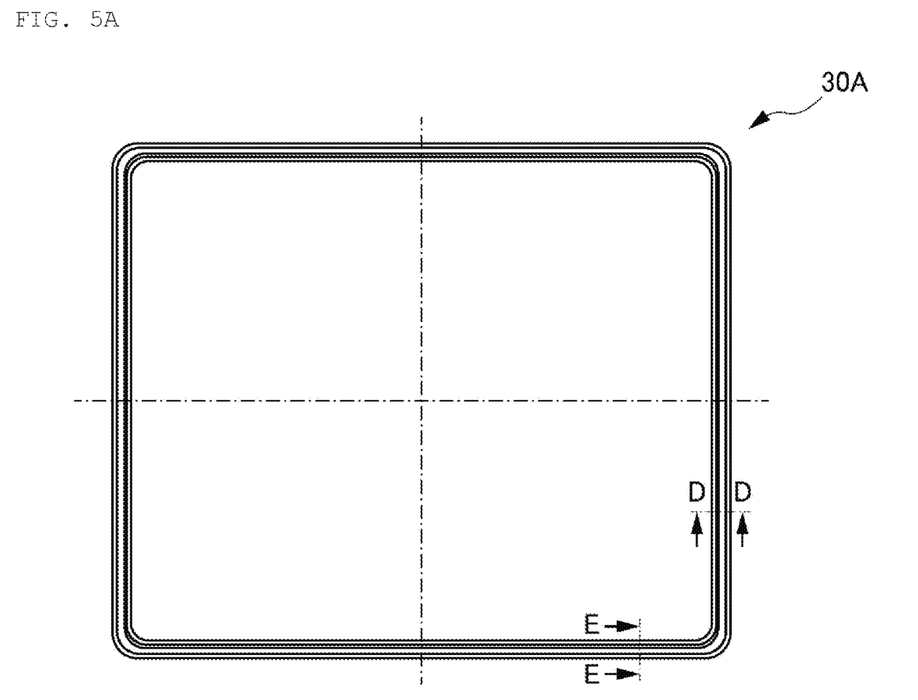
Figure 5B:
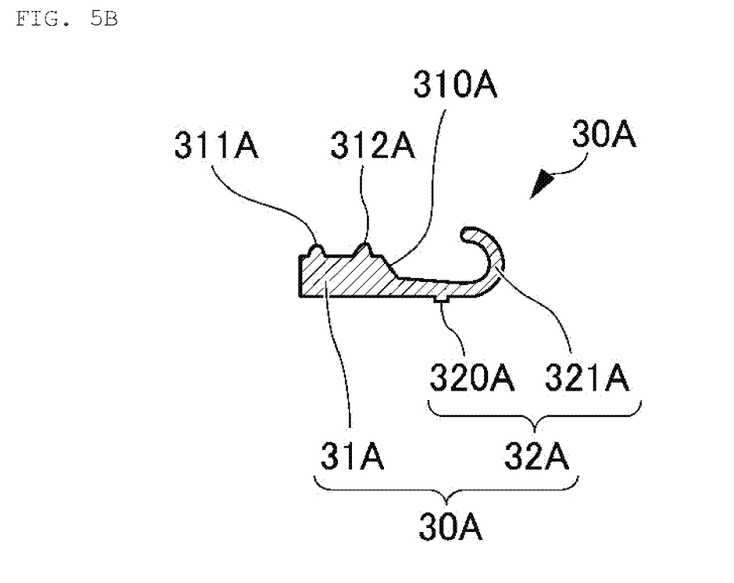
FIG. 5B shows a cross-sectional view taken along the lines DD and EE showing the packing according to a first modification.

FIG. 5A shows a plan view, and FIG. 5B shows a cross-sectional view taken along the lines DD and EE showing the packing 30A according to a first modification.

As shown in FIG. 5B, in the packing 30A of the first modification, the lid 20 side of the extended piece 32A stretches out in a flat manner, and a protrusion 320A is formed at the same position as in the aforementioned embodiment. Similarly to the above embodiment, the seal portion 321A is separated from the lid 20 side, is inverted toward the seal surface 12 side and the main body 31A side, and is in contact with the seal surface 12. Note that main body 31A is formed with a first fitting protrusion 311A and a second fitting protrusion 312A; furthermore, a flat surface 310A is formed on the container body 10 side.

Also in this first modification, the sealing performance with respect to the positive pressure is improved substantially as in the embodiment. Moreover, since the space formed between the main body 31A, the protrusion 320A, and the lid 20 is small (by substantially squishing and disappearing the space), cleaning liquid for cleaning the substrate container 1 has difficulties being left behind.

Figure 6:
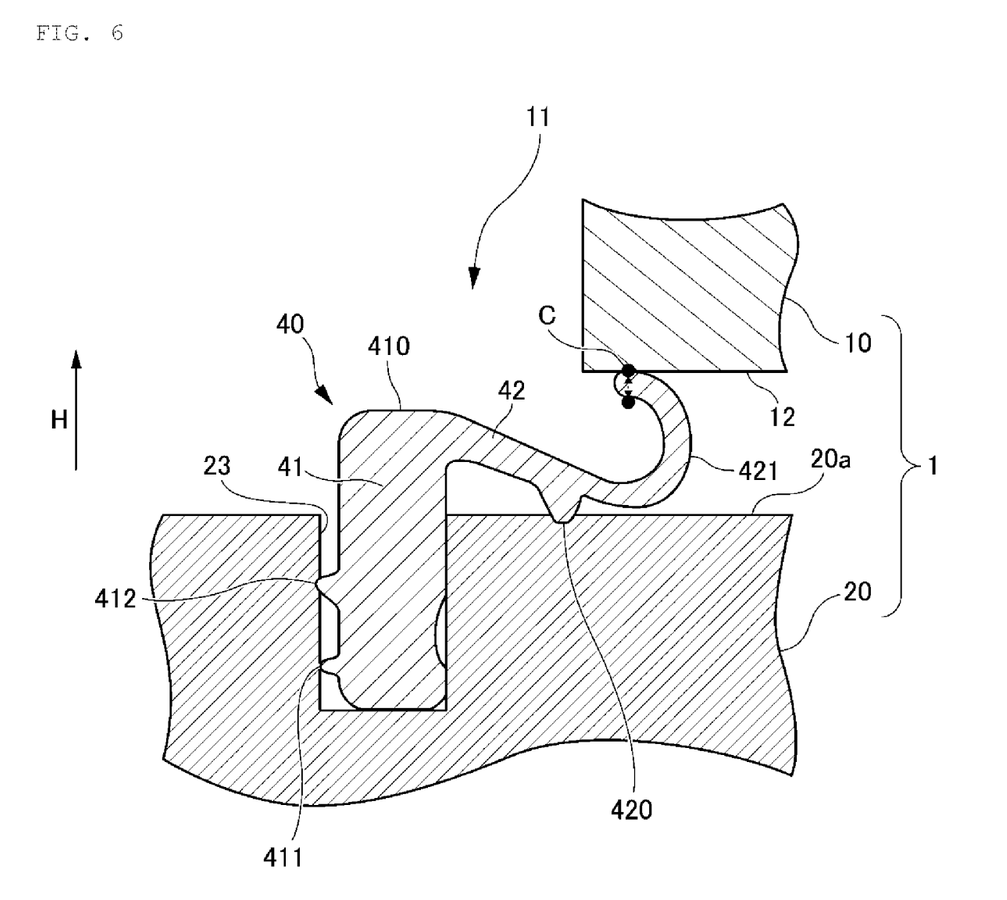
FIG. 6 is a schematic partial cross-sectional view showing a state in which the container body and the lid are in the middle of being closed using the packing of a second modification.

FIG. 6 is a schematic partial cross-sectional view showing a state in which the container body 10 and the lid 20 are in the middle of being closed using the packing 40 of a second modification.

In the substrate storage container 1 using the packing 30A of the above-described embodiment or modification 1, the main body 31 of the either of the packings 30 and 30A is attached to the attachment groove 21 formed along the direction substantially orthogonal to the closing direction H of the lid 20, but the packing 40 of the second modification is different in that the packing is attached to an attachment groove 23 formed along the closing direction H of the lid 20.

As shown in FIG. 6, the packing 40 is formed in a substantially "コ" shape having a main body 41 fitted in the attachment groove 23, and an extended piece 42 extending from the main body 41.

The main body 41 is formed in an annular shape similar to that of the attachment groove 23 of the lid 20, and has a substantially rectangular shape so that the cross-section thereof corresponds to the cross-sectional shape of the attachment groove 21. The main body 41 has a flat surface 410 on the side opposite to the bottom side of the attachment groove 21 so that the packing 40 can be pushed into the bottom side of the attachment groove 23.

Also, in the main body 41, a first fitting protrusion 411 on the bottom side of the attachment groove 23 (on the front side of the substrate storage container 1) and a second fitting protrusion 412 on the opening side of the attachment groove 23 (on the container body 10 side) are formed side by side so as to face the inside of the lid 20, and the first fitting protrusion 411 and the second fitting protrusion 412 are each formed so as to be tapered.

On the other hand, the extended piece 42 has a protrusion 420 projecting toward the lid 20 in the closing direction H of the lid 20, and has a seal portion 421 located at an end beyond the protrusion 420. Further, the extending piece 42 has one portion of a surface facing the container body 10 which approaches the lid 20 from the main body 31 toward the protrusion 420.

The seal portion 421 is inverted (in a J shape) toward the seal surface 12 side and the main body 41 side and is in contact with the seal surface 12. At this time, the contact position C between the seal surface 12 and the seal portion 421 either overlaps with the protrusion 420 or is separated outward from the protrusion 420 when viewed from the closing direction H of the lid 20.

Then, when the inside of the substrate storage container 1 becomes a positive pressure, because the seal portion 421 is deformed so as to expand from the protrusion 420 of the packing 40 as a base point, the seal portion 421 is pressed against the seal surface 12. Moreover, when the inside of the substrate storage container 1 becomes a negative pressure, because the seal portion 421 is deformed by being pressed against the side of the main body 41 (attachment groove 23) with the protrusion 420 of the packing 40 as a base point, the elastic force of the seal portion 421 increases and is pressed against the seal surface 12. Thus, even in the packing 40 of the second modification, sealability can be improved, and gas leakage and entry of dust from the outside can be suppressed.

In the above embodiment, the air supply valve 18 and the exhaust valve 19 each having a check valve function are provided on the bottom surface of the container body 10, but each need not have a check valve function, and may instead be a breathing specification with supply/exhaust units. Even as such an example of the supply/exhaust units, an inert gas is allowed to flow into the substrate storage container 1 from one of the supply/exhaust units, and then by having a configuration so that the gas flows out from the other air supply/exhaust unit, the gas inside the substrate storage container 1 can be replaced or an airtight state can be maintained; further, confirming whether or not the gas replacement operation is being performed reliably is possible by detecting the gas on the gas outflow side.

In the aforementioned embodiments, in order to prevent the packing 30, 30A, 40 from sticking to the seal surface 12 of the container body 10, a texture may also be applied.

Although the preferred embodiments of the present invention have been described above in detail, the present invention is not limited to the embodiments described above, and various modifications and changes can be made within the scope of the gist of the present invention described in the claims.

1 Substrate Storage Container
10 Container Body
11 Opening
12 Seal Surface
13 Supports
14 Robotic Flange
15 Manual Handles
18 Air Supply Valve
19 Exhaust Valve
20 Lid
20a Back Surface
21 Attachment Groove
22 Convex Portion
23 Attachment Groove
30, 30A, 30R Packing
31, 31A, 31R Main Body
310, 310A, 310R Flat Surface
311, 311A First Fitting Protrusion
312, 312A Second Fitting Protrusion
32, 32A, 32R Extended Piece
320, 320A Protrusion
321, 321A, 321R Seal Portion
40 Packing
41 Main Body
410 Flat Surface
411 First Fitting Protrusion
412 Second Fitting Protrusion
42 Extended Piece
420 Protrusion
421 Seal Portion
W Substrates
C Contact Position
S Distance

The invention claimed is:

1. A substrate storage container comprising:
a container body that stores substrates,
a lid that closes an opening of the container body, and
an annular packing provided between the container body and the lid,
wherein the container body has a seal surface which is in contact with the annular packing,
wherein the lid is provided with an attachment groove for attaching the annular packing,
wherein the annular packing is formed of a main body which is fitted in the attachment groove and an extended piece extending from the main body,
wherein the extended piece has a protrusion protruding toward the lid in the closing direction of the lid, and has a seal portion located at an end beyond the protrusion,
the extended piece is inclined toward the lid as the extended piece extends away from the main body such that the protrusion is pressed against and contacts with the lid when the main body is fitted into the attachment groove,
wherein the seal portion is formed to have a J-shaped cross section such that a tip portion thereof extends toward the main body and is contactable with the seal surface, and
wherein the tip portion of the seal portion extends back toward the main body with the tip portion extending back being shorter than the extended piece in a direction back toward the main body.

2. The substrate storage container according to claim 1, wherein a contact position between the seal surface and the seal portion either overlaps with the protrusion or is separated outward from the protrusion when viewed from a closing direction of the lid.

3. The substrate storage container according to claim 2, wherein a surface of the extended piece facing the container body is configured to approach the lid from the main body toward the protrusion in a situation that the seal portion does not contact with the seal surface.

4. The substrate storage container according to claim 2, wherein the main body has at least partly a flat surface on a side of the extended piece and the annular packing is configured to be pushed into the attachment groove.

5. The substrate storage container according to claim 2, wherein the tip portion of the seal portion extends back toward the main body such that the protrusion of the extended piece is closer to the main body than the tip portion of the seal portion.

6. The substrate storage container according to claim 1, wherein a surface of the extended piece facing the container body is configured to approach the lid from the main body toward the protrusion in a situation that the seal portion does not contact with the seal surface.

7. The substrate storage container according to claim 6, wherein the main body has at least partly a flat surface on a side of the extended piece and the annular packing is configured to be pushed into the attachment groove.

8. The substrate storage container according to claim 6, wherein the tip portion of the seal portion extends back toward the main body such that the protrusion of the extended piece is closer to the main body than the tip portion of the seal portion.

9. The substrate storage container according to claim 1, wherein the main body has at least partly a flat surface on a side of the extended piece and the annular packing is configured to be pushed into the attachment groove.

10. The substrate storage container according to claim 1, wherein the tip portion of the seal portion extends back toward the main body such that the protrusion of the extended piece is closer to the main body than the tip portion of the seal portion.

* * * * *